United States Patent
Han et al.

(10) Patent No.: US 11,594,503 B2
(45) Date of Patent: Feb. 28, 2023

(54) WIRE BONDING METHOD FOR SEMICONDUCTOR PACKAGE

(71) Applicant: SAMSUNG ELECTRONICS CO., LTD., Suwon-si (KR)

(72) Inventors: Hosoo Han, Suwon-si (KR); Yongje Lee, Suwon-si (KR)

(73) Assignee: SAMSUNG ELECTRONICS CO., LTD.

( * ) Notice: Subject to any disclaimer, the term of this patent is extended or adjusted under 35 U.S.C. 154(b) by 72 days.

(21) Appl. No.: 17/199,273

(22) Filed: Mar. 11, 2021

(65) Prior Publication Data

US 2021/0358873 A1    Nov. 18, 2021

(30) Foreign Application Priority Data

May 14, 2020   (KR) .................. 10-2020-0057817

(51) Int. Cl.
    *B23K 20/00*     (2006.01)
    *H01L 23/00*     (2006.01)

(52) U.S. Cl.
    CPC ............. *H01L 24/05* (2013.01); *B23K 20/005* (2013.01); *H01L 24/78* (2013.01); *H01L 24/85* (2013.01); *H01L 2224/0555* (2013.01); *H01L 2224/7855* (2013.01); *H01L 2224/78301* (2013.01); *H01L 2224/85205* (2013.01)

(58) Field of Classification Search
    CPC ............. H01L 24/05; H01L 2224/0555; H01L 2224/78301; H01L 2224/7855; H01L 2224/85205; H01L 24/78; H01L 24/85; B23K 20/005

USPC ......................................................... 257/734
See application file for complete search history.

(56) References Cited

U.S. PATENT DOCUMENTS

| | | |
|---|---|---|
| 8,899,469 B2 | 12/2014 | Gillotti et al. |
| 9,165,842 B2 | 10/2015 | Gillotti |
| 9,314,869 B2 | 4/2016 | Lee et al. |
| 9,368,471 B2 | 6/2016 | Akiyama et al. |
| 9,457,421 B2 | 10/2016 | Sekine et al. |
| 9,502,374 B2 | 11/2016 | Song et al. |
| 9,899,348 B2 | 2/2018 | Sekine |

(Continued)

FOREIGN PATENT DOCUMENTS

| | | |
|---|---|---|
| JP | 6426000 B2 | 12/2013 |
| JP | 6118960 B2 | 4/2017 |

(Continued)

*Primary Examiner* — Didarul A Mazumder
(74) *Attorney, Agent, or Firm* — Myers Bigel, P.A.

(57) ABSTRACT

A wire bonding method includes bonding a tip of a wire provided through a clamp and a capillary onto a bonding pad of a chip, moving the capillary to a connection pad of a substrate corresponding to the bonding pad, bonding the wire to the connection pad to form a bonding wire connecting the bonding pad to the connection pad, before the capillary is raised from the connection pad, applying a electrical signal to the wire to detect whether the wire and the connection pad are in contact with each other, changing a state of the clamp to a closed state when the wire is not in contact with the connection pad and maintaining the state of the clamp in an open state when the wire is in contact with the connection pad, and raising the capillary from the connection pad while maintaining the state of the clamp.

19 Claims, 20 Drawing Sheets

(56) References Cited

U.S. PATENT DOCUMENTS

| 2005/0133563 | A1* | 6/2005 | Kim | H01L 24/78 |
| | | | | 228/110.1 |
| 2011/0278349 | A1* | 11/2011 | Tei | B23K 20/007 |
| | | | | 228/141.1 |
| 2018/0151532 | A1 | 5/2018 | Jindo et al. | |

FOREIGN PATENT DOCUMENTS

| KR | 100625938 B1 | 9/2006 |
| KR | 101672510 B1 | 11/2016 |

* cited by examiner

WIRE BONDING METHOD FOR SEMICONDUCTOR PACKAGE

CROSS-REFERENCE TO RELATED APPLICATION

This application claims the benefit of Korean Patent Application No. 10-2020-0057817, filed on May 14, 2020, in the Korean Intellectual Property Office, the disclosure of which is incorporated herein in its entirety by reference.

BACKGROUND

The inventive concept relates to a wire bonding method for a semiconductor package, and more particularly, to a method of forming a bonding wire connecting a package substrate included in a semiconductor package to a semiconductor chip.

A semiconductor package may include a package substrate and a semiconductor chip mounted on the package substrate. The semiconductor chip may be mounted on the package substrate by using an adhesive member. In addition, a bonding wire may be formed to electrically connect the package substrate to the semiconductor chip. As the degree of integration of semiconductor chips required by electronic devices has increased, the number of bonding wires included in semiconductor packages also has increased. As such, faster speed bonding equipment for forming bonding wires may be required.

SUMMARY

The inventive concept provides a wire bonding method for a semiconductor package, the method including an automatic recovery process for solving a temporary suspension of bonding equipment due to a poor contact of a bonding wire and thus the manufacturing efficiency of the semiconductor package may be increased.

The inventive concept is not limited to the ones described herein, and additional concepts will be clearly understood by those skilled in the art from the description below.

According to an aspect of the inventive concept, there is provided a wire bonding method including bonding a tip of a wire provided through a clamp and a capillary onto a bonding pad of a semiconductor chip, moving the capillary to a connection pad of a package substrate corresponding to the bonding pad, bonding the wire to the connection pad to form a bonding wire connecting the bonding pad to the connection pad, applying a first electrical signal to the wire to detect whether the wire and the connection pad are in contact with each other, changing a state of the clamp to a closed state when the wire is not in contact with the connection pad and maintaining the state of the clamp in an open state when the wire is in contact with the connection pad, and raising the capillary from the connection pad while maintaining the state of the clamp.

According to another aspect of the inventive concept, there is provided a wire bonding method including forming a first bonding wire by continuously bonding a wire passing through a clamp and a capillary to a bonding pad of a semiconductor chip and a connection pad of a package substrate, before the capillary is raised from the connection pad in order to form a second bonding wire, applying a first electrical signal to the wire to detect whether the wire and the connection pad are in contact with each other, changing a state of the clamp to a closed state when the wire is not in contact with the connection pad to locate the tip of the wire inside the capillary, and raising the capillary from the connection pad while maintaining the closed state of the clamp.

According to another aspect of the inventive concept, there is provided a wire bonding method including attaching a semiconductor chip on a package substrate, ball-bonding a first free air ball formed on a tip of a wire to a first bonding pad of the semiconductor chip, the wire provided through a reel and passing through a clamp and a capillary, moving the capillary to a first connection pad of the package substrate corresponding to the first bonding pad such that the wire forms a loop, stitch-bonding the wire to the first connection pad to form a first bonding wire connecting the first bonding pad to the first connection pad, applying a first electrical signal to the wire to detect whether the wire and the first connection pad are in contact with each other, changing a state of the clamp to a closed state when the wire is not in contact with the first connection pad, raising the capillary from the first connection pad while maintaining the closed state of the clamp, changing the state of the clamp to an open state and vibrating the capillary up and down such that the tip of the wire protrudes from the capillary, lowering the capillary such that the tip of the wire is in contact with the first connection pad, applying a second electrical signal to the wire to detect whether the tip of the wire and the first connection pad are in contact with each other, changing the state of the clamp to a closed state when the tip of the wire and the first connection pad are in contact with each other and raising the capillary again, and forming a second free air ball at the tip of the wire.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
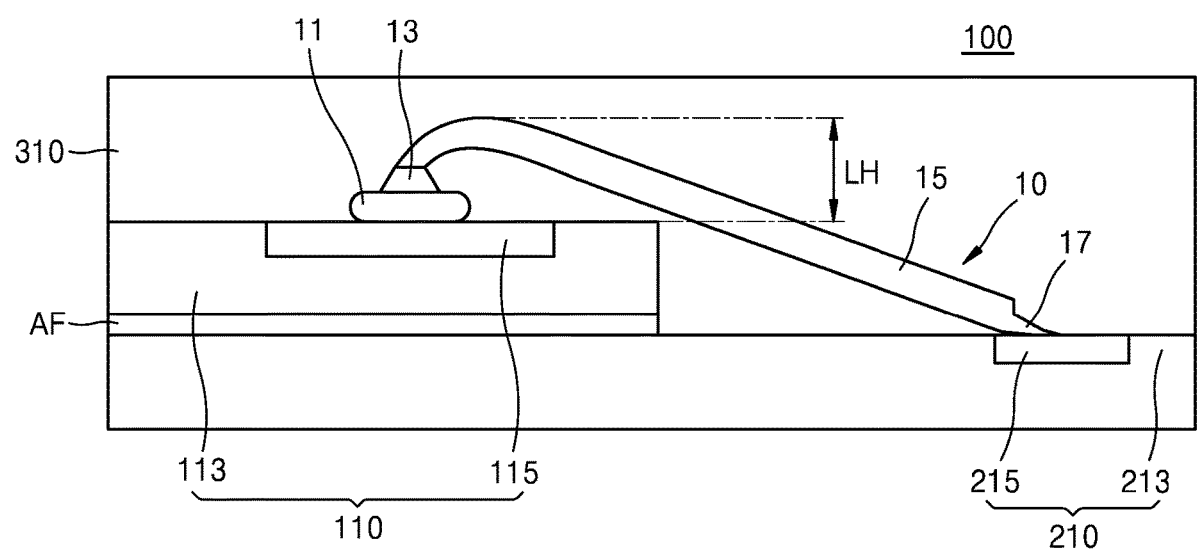
FIG. 1 is a cross-sectional view of a semiconductor package including a bonding wire manufactured by a wire bonding method according to an embodiment of the inventive concept.

FIG. 1 is a cross-sectional view of a semiconductor package 100 including a bonding wire manufactured by a wire bonding method according to an embodiment of the inventive concept.

Referring to FIG. 1, the semiconductor package 100 may include a semiconductor chip 110, a package substrate 210, a molding member 310, and a bonding wire 10 formed by a wire bonding method according to an embodiment of the inventive concept.

The semiconductor package 100 may include the semiconductor chip 110 mounted on the package substrate 210 in a vertical direction. The semiconductor chip 110 may be electrically connected to the package substrate 210 through the bonding wire 10.

Although the illustrated semiconductor package 100 includes one semiconductor chip 110 mounted therein, it is understood that the number of semiconductor chips mounted in a semiconductor package 100 according to the inventive concept is not limited thereto. For example, a plurality of semiconductor chips 110 may be mounted in the semiconductor package 100.

In addition, the semiconductor chip 110 may include a memory chip and/or a logic chip. For example, when a plurality of semiconductor chips 110 are mounted in the semiconductor package 100, all of the semiconductor chips 110 may be the same type of memory chips, or some of the semiconductor chips 110 may be memory chips and the rest of the semiconductor chips 110 may be logic chips.

Each of the memory chips may be a volatile memory chip or a nonvolatile memory chip. The volatile memory chip may be implemented as, for example, dynamic random access memory (DRAM), static RAM (SRAM), thyristor RAM (TRAM), or the like, but is not limited thereto. In addition, the nonvolatile memory chip may be implemented as, for example, flash memory, magnetic RAM (MRAM), spin-transfer torque MRAM (STT-MRAM), ferroelectric RAM (FRAM), phase change RAM (PRAM), resistive RAM (RRAM), or the like, but is not limited thereto.

The logic chip may be implemented as, for example, a microprocessor, a graphics processor, a signal processor, a network processor, a chipset, an audio codec, a video codec, an application processor, a system on chip, or the like, but is not limited thereto.

The semiconductor chip 110 may include a semiconductor substrate 113 and a bonding pad 115. The semiconductor substrate 113 may have an upper surface and a lower surface, which face each other. The semiconductor substrate 113 may include a semiconductor device (not shown). The bonding pad 115 may be formed on the semiconductor device. A material constituting the bonding pad 115 may include at least one of aluminum (Al), copper (Cu), nickel (Ni), tungsten (W), platinum (Pt), and gold (Au), but is not limited thereto. The bonding pad 115 may be referred to as a first bonding pad.

The semiconductor substrate 113 may include, for example, silicon. Alternatively, the semiconductor substrate 113 may include a semiconductor element such as germanium, or a compound semiconductor such as silicon carbide (SiC), gallium arsenide (GaAs), indium arsenide (InAs), or indium phosphide (InP). Alternatively, the semiconductor substrate 113 may have a silicon on insulator (SOI) structure. For example, the semiconductor substrate 113 may include a buried oxide (BOX) layer. The semiconductor substrate 113 may include a conductive region, for example, a well doped with impurities or a structure doped with impurities. In addition, the semiconductor substrate 113 may have various device isolation structures, such as a shallow trench isolation (STI) structure, for example.

A passivation layer (not shown) for protecting the semiconductor device and other structures in the semiconductor substrate 113 from external impact or moisture may be formed on the semiconductor substrate 113. The passivation layer may expose at least a portion of an upper surface of the bonding pad 115.

An adhesive film AF may be arranged between the upper surface of the package substrate 210 and the lower surface of the semiconductor chip 110 to attach the semiconductor chip 110 onto the package substrate 210. The adhesive film AF may be, for example, a die attach film (DAF). The DAF may be an inorganic adhesive or a polymer adhesive, and may also be a hybrid type made by mixing the two components, that is, the inorganic adhesive and the polymer adhesive.

The package substrate 210 is a support and mounting substrate and may include a body portion 213 and a protective layer. The package substrate 210 may be formed based on a printed circuit board (PCB), a wafer substrate, a ceramic substrate, a glass substrate, an interposer, or the like. In some embodiments, the package substrate 210 may be a PCB. However, the package substrate 210 is not limited to a PCB.

An internal wiring line (not shown) may be formed in the package substrate 210, and the internal wiring line may be electrically connected to the semiconductor chip 110 through a bonding wire 10 connected to a connection pad 215 on the upper surface of the package substrate 210. The connection pad 215 may be referred to as a first connection pad.

When the package substrate 210 is a PCB, the body portion 213 may be formed by compressing a polymer material such as thermosetting resin, epoxy resin such as flame retardant 4 (FR-4), bismaleimide triazine (BT), or an Ajinomoto build-up film (ABF), or phenol resin to a certain thickness to form a thin profile, coating both surfaces of the thin profile with a copper foil, and forming an internal wiring line, i.e., the transmission path of electrical signals, using patterning.

Exemplary PCBs may be a single layer PCB with an internal wiring line only at one side thereof, and a double layer PCB having an internal wiring line at each of both sides thereof. In addition, three or more layers of copper foil may be formed using an insulator, such as prepreg, and three or more internal wiring lines may be formed according to the number of layers of copper foil, so that a multi-layered PCB may be implemented. However, the package substrate 210 is not limited to the structure or material of a PCB described above.

The molding member 310 may be formed on the package substrate 210 to surround the semiconductor chip 110 and the bonding wire 10.

The molding member 310 may include, for example, an epoxy molding compound. In other embodiments, the molding member 310 is not limited to an epoxy molding compound and may include various materials, such as an epoxy-based material, a thermosetting material, a thermoplastic material, or an ultraviolet (UV) treatment material. The thermosetting material may include a phenol-type, acid anhydride-type, or amine-type curing agent and an acrylic polymer additive.

The molding member 310 is formed by injecting an appropriate amount of a molding material onto the package substrate 210 through an injection process, and the outer shape of the semiconductor package 100 is formed through a curing process. When necessary, the outer shape of the semiconductor package 100 is formed by applying pressure to the molding material in a pressing process such as a press. In this case, process conditions such as a delay time between the injection and the pressing of the molding material, an amount of the injected molding material, and a pressing temperature/pressure may be set by considering physical properties such as viscosity of the molding material.

The side and upper surfaces of the molding member 310 may be at right angles. Although not shown in the drawings, marking patterns including information of the semiconductor chip 110, for example, barcodes, QR codes, numbers, letters, and symbols, may be formed on the side and/or upper surfaces of the molding member 310.

The molding member 310 may protect the semiconductor chip 110 and the bonding wire 10 from external influences such as contamination and impact. In order to perform this function, the molding member 310 may surround both the semiconductor chip 110 and the bonding wire 10 and have a certain thickness. Because the molding member 310 entirely covers the package substrate 210, the width of the molding member 310 may be substantially the same as the width of the semiconductor package 100.

The bonding wire 10 formed by the wire bonding method according to the embodiment of the inventive concept may be formed to electrically connect the bonding pad 115 to the connection pad 215.

At least one of a control signal, a power signal, and a ground signal for the operation of the semiconductor chip 110 may be provided from outside of the semiconductor package 100 through the bonding wire 10. In addition, a data signal to be stored in the semiconductor chip 110 may be provided from outside of the semiconductor package 100 through the bonding wire 10, or data stored in the semiconductor chip 110 may be provided to another device or component outside of the semiconductor package 100.

Although the illustrated bonding wire 10 is arranged only on one surface of the semiconductor chip 110 as an example, the arrangement of the bonding wire 10 is not limited thereto. For example, the bonding wire 10 may be arranged on two or more surfaces of the semiconductor chip 110.

A material constituting the bonding wire 10 may include at least one of gold (Au), silver (Ag), copper (Cu), and aluminum (Al). In some embodiments, the bonding wire 10 may be connected to the bonding pad 115 by any one of a thermo compression connection method and an ultra sonic connection method, or may be connected to the bonding pad 115 by a thermo sonic connection method obtained by a combination of the thermo compression connection method and the ultra sonic connection method.

The bonding wire 10 may include a ball portion 11, a neck portion 13, a wire portion 15, and a stitch portion 17. Specifically, the ball portion 11 may be located to directly contact the upper surface of the bonding pad 115. The neck portion 13 may be located on the upper surface of the ball portion 11. The stitch portion 17 may be located to directly contact the upper surface of the connection pad 215. The wire portion 15 may be connected between the neck portion 13 and the stitch portion 17. That is, the bonding pad 115 and the bonding wire 10 may be bonded to each other by a ball bonding method, and the connection pad 215 and the bonding wire 10 may be bonded to each other by a stitch bonding method.

In general, the bonding wire 10 may have an arcuate or loop shape (i.e., the bonding wire 10 has at least some curvature). In the illustrated embodiment, the height from the upper surface of the bonding pad 115 to the uppermost surface of the bonding wire 10 may be referred to as a loop height LH. The thickness of the molding member 310 on the semiconductor chip 110 may be greater than the loop height LH of the bonding wire 10 in order to prevent the bonding wire 10 from being exposed to the outside.

As the degree of integration of the semiconductor chip 110 required by an electronic device increases, the number of bonding wires 10 included in the semiconductor package 100 increases. Therefore, a fast working speed of bonding equipment for forming the bonding wire 10 is required.

Accordingly, the wire bonding method according to the embodiment of the inventive concept to be described later further includes an automatic recovery process for solving a temporary suspension of bonding equipment due to a poor contact of the bonding wire 10. Accordingly, the operation rate of the bonding equipment for forming the bonding wire 10 may increase, thereby ultimately increasing the manufacturing efficiency of the semiconductor package 100 and improving productivity and economical efficiency.

Figure 2:
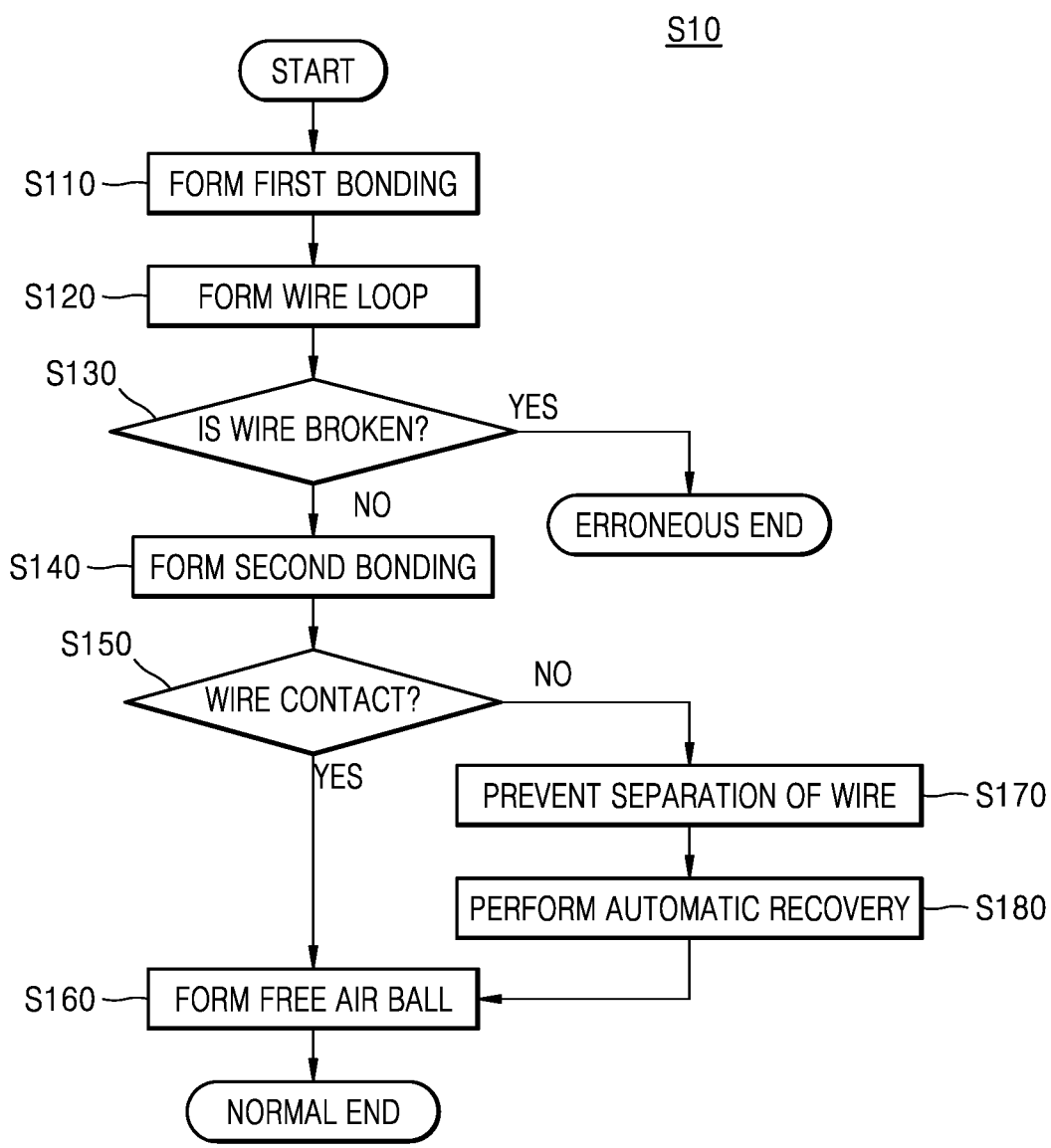
FIGS. 2 and 3 are flowcharts each illustrating a wire bonding method for a semiconductor package according to an embodiment of the inventive concept.
Figure 3:
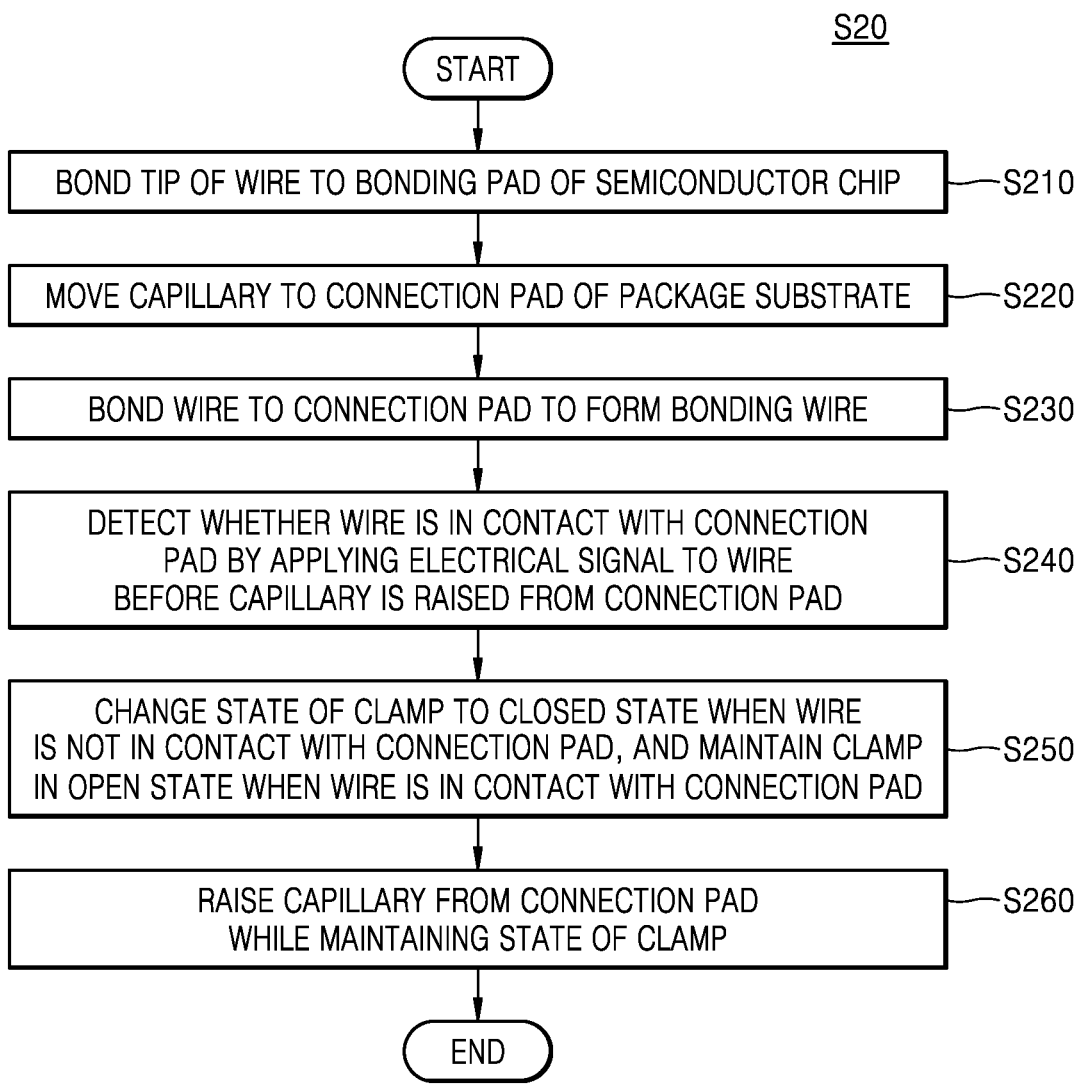

FIGS. 2 and 3 are flowcharts each illustrating a wire bonding method for a semiconductor package according to an embodiment of the inventive concept.

The wire bonding method for a semiconductor package according to the embodiment of the inventive concept may include processes described below. When an embodiment can be modified, the order of processes may be different from the order in which the processes are described. For example, two processes sequentially described may be substantially performed simultaneously or in reverse order.

Referring to FIG. 2, a wire bonding method S10 includes forming a first bonding on a bonding pad (operation S110), forming a wire loop (operation S120), detecting whether a wire is broken or not (operation S130), forming a second bonding on a connection pad (operation S140), detecting whether the wire is in contact with the connection pad (operation S150), forming a free air ball at the tip of the wire (operation S160), preventing separation of the wire (operation S170), and performing an automatic recovery process (operation S180).

In the wire bonding method S10, if it is determined that the wire is not broken (i.e., when no defect has occurred), based on a result of the operation S130 of detecting whether the wire is broken or not, the operation S140 of forming a second bonding on a connection pad is performed. If it is determined that the wire has been broken (i.e., when a defect has occurred), an error message is displayed and a wire bonding process is terminated.

In addition, if it is determined that the wire is in contact with the connection pad (i.e., when no defect has occurred), based on a result of the operation S150 of detecting whether the wire is in contact with the connection pad, the operation S160 of forming a free air ball at the tip of the wire is performed and one cycle of a bonding wire formation process is normally terminated.

If it is determined that the wire is not in contact with the connection pad (i.e., when a defect has occurred), the operation S170 of preventing the separation of the wire and the operation S180 of performing the automatic recovery process are sequentially performed. Then, the operation S160 of forming a free air ball at the tip of the wire is performed and one cycle of the wire bonding method S10 normally ends.

That is, the wire bonding method S10 according to the embodiment of the inventive step includes various operations to detect defects that may occur in a process of forming a bonding wire and further includes performing an automatic recovery process, thereby increasing the manufacturing efficiency of semiconductor packages and improving productivity and economical efficiency.

Referring to FIG. 3, a wire bonding method S20 includes bonding the tip of a wire to a bonding pad of a semiconductor chip (operation S210), moving a capillary to a connection pad of a package substrate (operation S220), bonding the wire to the connection pad to form a bonding wire (operation S230), detecting whether the wire is in contact with the connection pad by applying an electrical signal to the wire before the capillary is raised from the connection pad (operation S240), changing the state of a clamp to a closed state when the wire is not in contact with the connection pad and maintaining the clamp in an open state when the wire is in contact with the connection pad (operation S250), and raising the capillary from the connection pad while maintaining the state of the clamp (operation S260).

The wire bonding method S20 according to the embodiment of the inventive concept specifically describes detecting whether the wire is in contact with the connection pad by applying an electrical signal to the wire before the capillary is raised from the connection pad. When the wire is not in contact with the connection pad (i.e., when a defect has occurred), the state of the clamp may be changed to a closed state to prevent the wire from being separated from the capillary.

Therefore, when a bonding wire formation process is performed by the wire bonding method S20, even when a defect occurs in the process, a continuous process is possible without temporarily stopping bonding equipment, and thus, the operation rate of the bonding equipment may be significantly increased. Accordingly, the manufacturing efficiency of the semiconductor package may be increased, and productivity and economical efficiency may be improved.

Technical characteristics of each of the operations S210 to S260 will be described below in detail with reference to FIGS. 4 to 17.

FIGS. 4 to 17 are cross-sectional views illustrating the order of processes in a wire bonding method for a semiconductor package according to an embodiment of the inventive concept.

Figure 4:
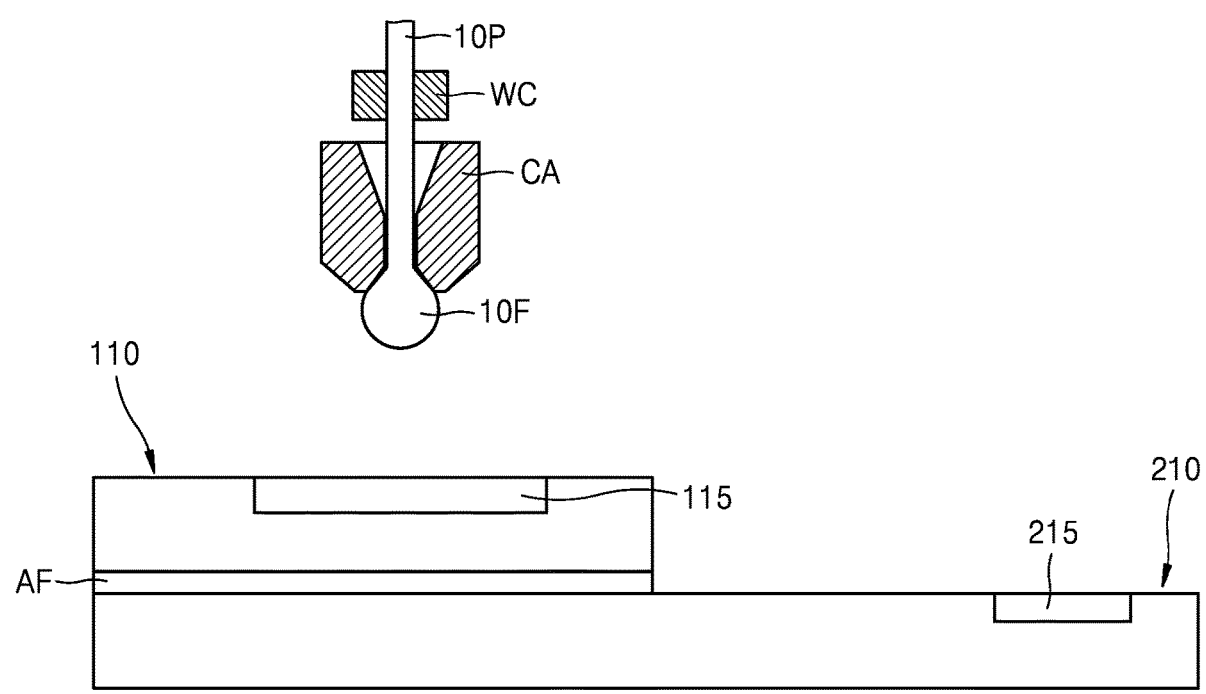
FIGS. 4 to 17 are cross-sectional views illustrating the order of processes in a wire bonding method for a semiconductor package according to an embodiment of the inventive concept.

Referring to FIG. 4, a semiconductor chip 110 may include a bonding pad 115, and a package substrate 210 may include a connection pad 215.

The semiconductor chip 110 may be mounted on the package substrate 210 such that the connection pad 215 is not covered. An adhesive film AF is located between the upper surface of the package substrate 210 and the lower surface of the semiconductor chip 110, and thus, the semiconductor chip 110 may be attached onto the package substrate 210.

A capillary CA may be arranged above the bonding pad 115 to be spaced apart from the bonding pad 115 by a certain distance. In some embodiments, the capillary CA may be located at a level corresponding to an electronic flame-off height that is a certain height from the bonding pad 115.

A portion of a wire 10P may protrude from a center hole of the capillary CA. A material constituting the wire 10P may include at least one of Au, Ag, Cu, and Al. Electric spark may be provided to the wire 10P protruding from the center hole of the capillary CA, and thus, a lower end of the wire 10P may be melted. Accordingly, in the center hole of the capillary CA, a free air ball 10F may be formed at the lower end of the wire 10P. In some embodiments, ultrasonic energy or thermal energy may be provided to the lower end of the wire 10P instead of the electric spark.

The wire 10P may be restricted from moving in the capillary CA by a closing operation of a clamp WC.

Figure 5:
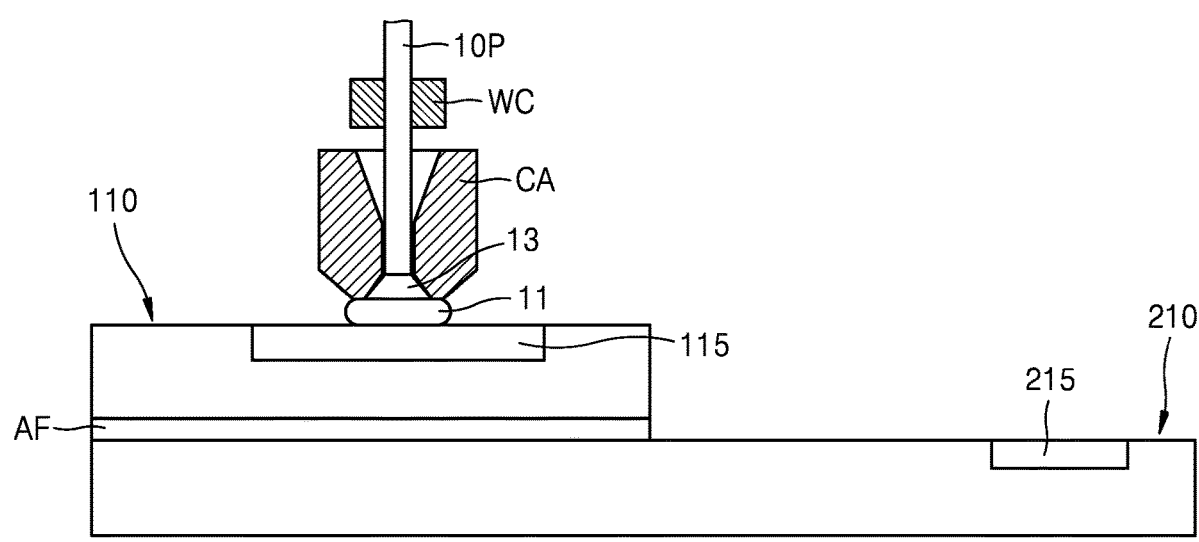

Referring to FIG. 5, the capillary CA may move toward the bonding pad 115, and thus the free air ball 10F (refer to FIG. 4) may contact the bonding pad 115.

The free air ball 10F (refer to FIG. 4) may be compressed between the capillary CA and the bonding pad 115, and thus the ball portion 11 and the neck portion 13 may be formed under the lower end of the wire 10P. Thermal energy and/or ultrasonic energy may be provided to the semiconductor chip 110 such that the ball portion 11 is bonded to the bonding pad 115. Bonding by a ball bonding method in which the ball portion 11 is bonded to the bonding pad 115 may be implemented.

The neck portion 13 may have a shape according to a chamfer angle inside the capillary CA. The diameter of the neck portion 13 may be less than the diameter of the ball portion 11, and accordingly, the neck portion 13 may be arranged to be completely seated on the upper surface of the ball portion 11.

Figure 6:
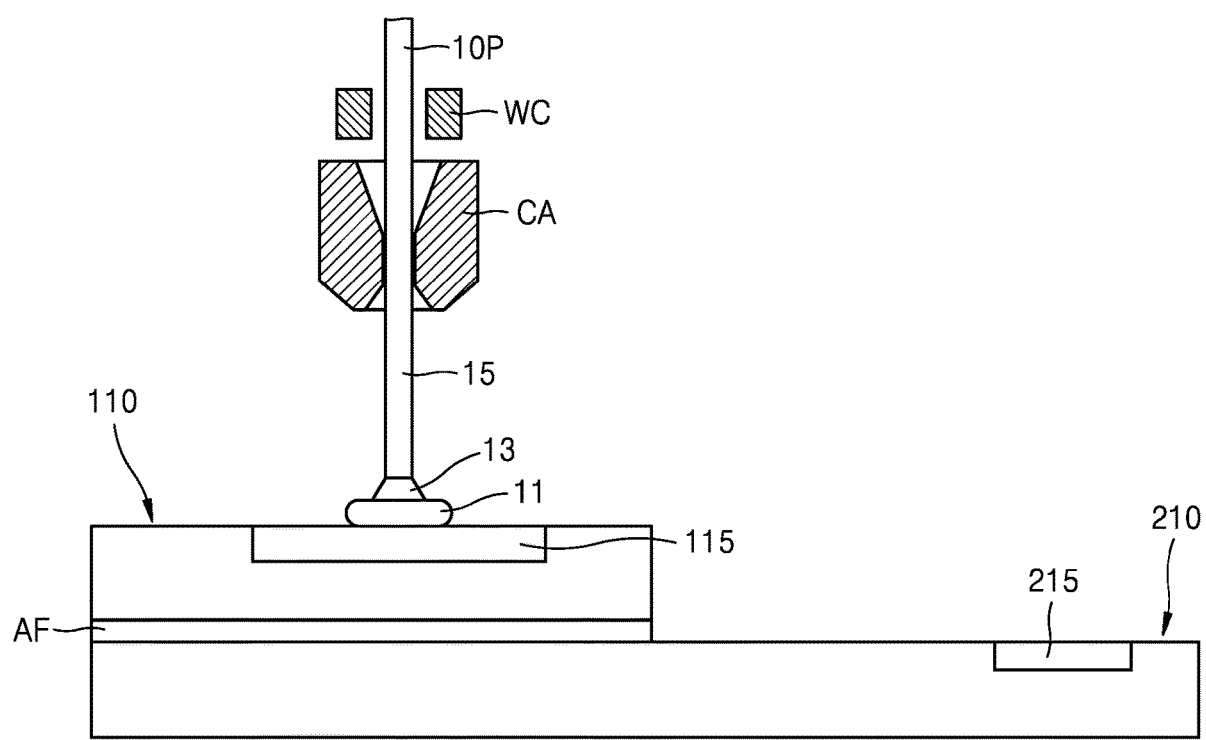

Referring to FIG. 6, the capillary CA may move upward in a vertical direction from the upper surface of the bonding pad 115 to expose the neck portion 13 and the wire 10P to the outside of the capillary CA.

The capillary CA may vertically rise to be located at a height corresponding to a certain distance from the bonding pad 115. In some embodiments, the wire 10P may form a wire portion 15, which extends vertically from the upper surface of the neck portion 13, by an open state of the clamp WC.

Figure 7:
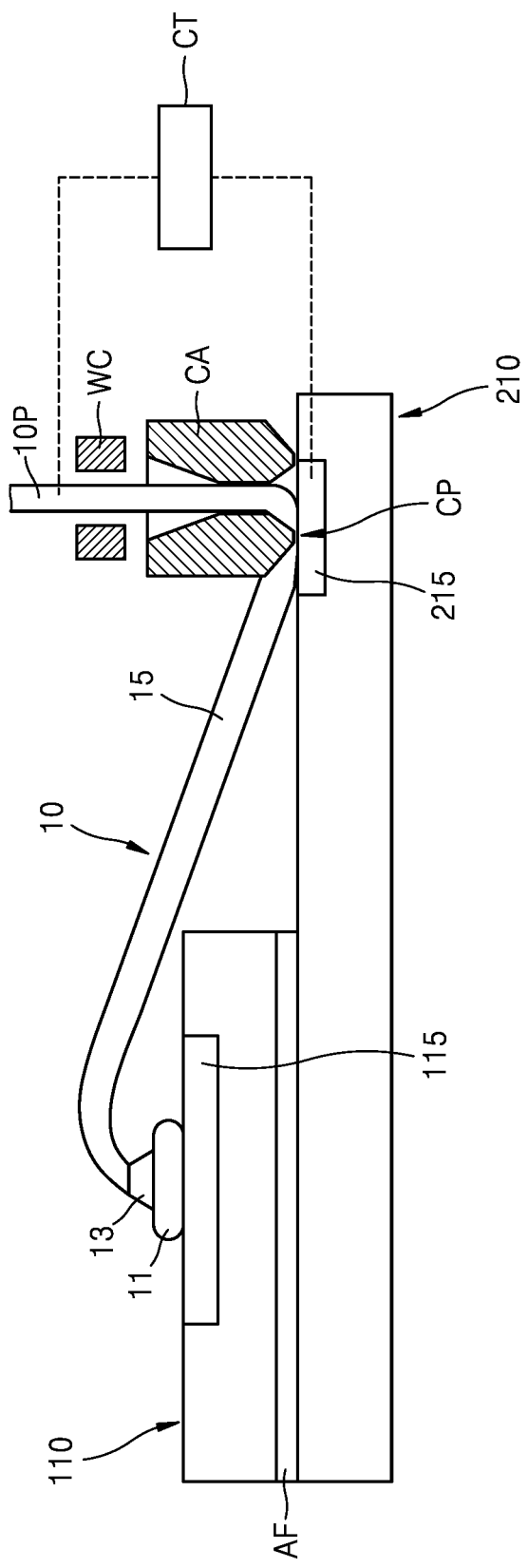

Referring to FIG. 7, the capillary CA that is upwardly moved in the vertical direction from the bonding pad 115 may slide toward the connection pad 215.

As the capillary CA slides while the clamp WC is open, the wire portion 15 discharged from the lower end of the capillary CA may extend along the sliding of the capillary CA.

Accordingly, the wire portion 15 may be formed between the bonding pad 115 and the connection pad 215. The wire portion 15 may form a wire loop, and the wire portion 15 may move along the curvature trajectory of the capillary CA without being cut off.

Before the capillary CA moves upward from the connection pad 215, a controller CT may apply a first electrical signal to the wire 10P and the connection pad 215 to detect whether the wire 10P is in contact with the connection pad 215. The first electrical signal may be a signal for checking whether the connection pad 215 and the wire 10P are electrically connected.

Figure 8:
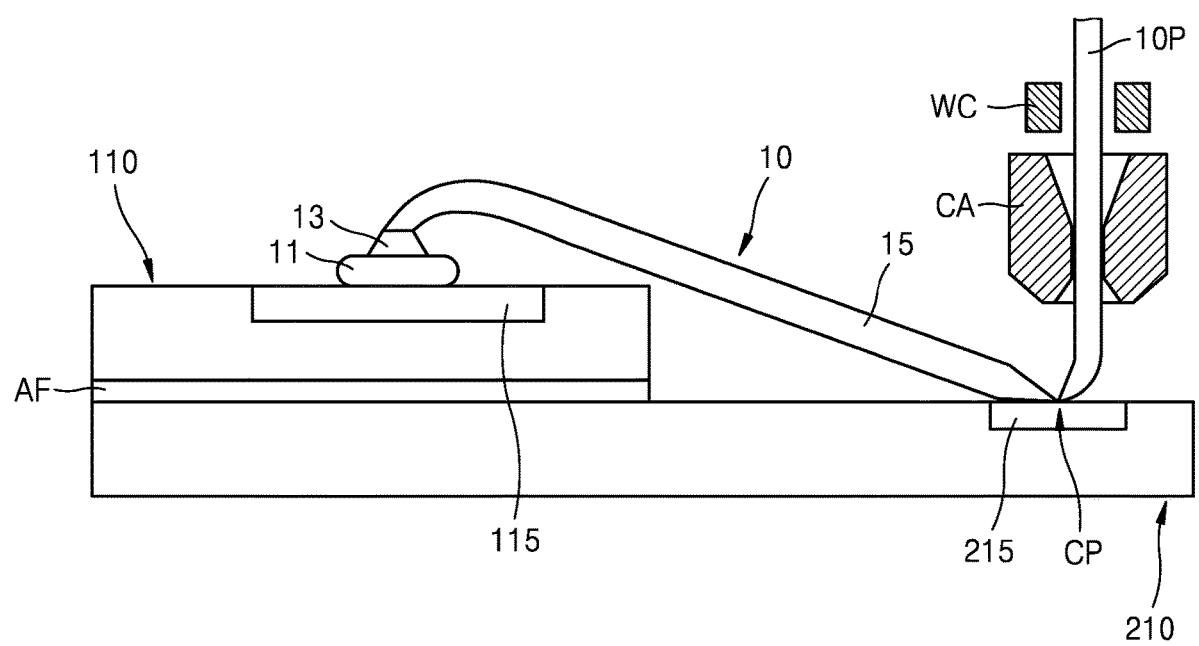

Referring to FIG. 8, when it is confirmed that the wire 10P is in contact with a contact point CP of the connection pad 215, the capillary CA may move upward in the vertical direction from the upper surface of the connection pad 215 in an open state of the clamp WC.

In a state in which the wire 10P is in contact with the contact point CP of the connection pad 215, the wire 10P may extend. That is, when a contact failure does not occur as described above, the wire 10P may protrude to the outside of the capillary CA and be electrically connected to the connection pad 215.

Figure 9:
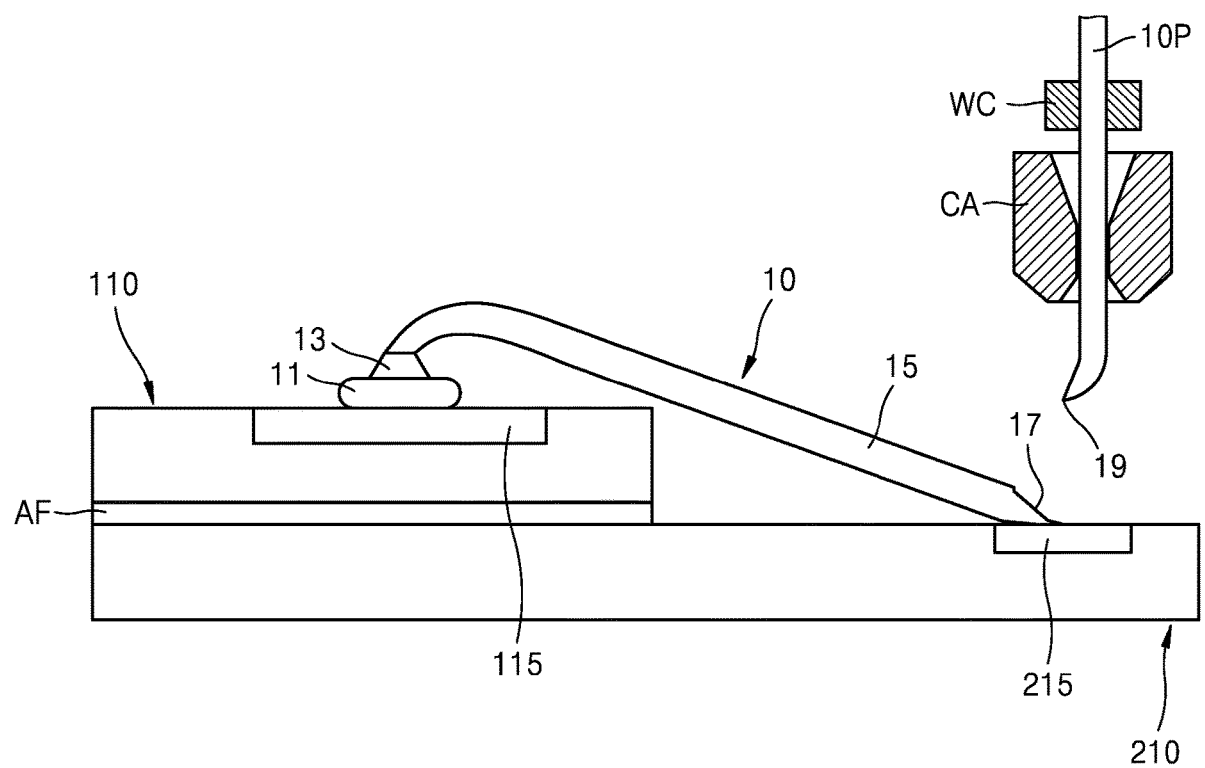

Referring to FIG. 9, as the capillary CA continuously moves upward while the clamp WC is open, the wire 10P may be completely broken from the stitch portion 17, and thus, a bonding wire 10 electrically connecting the bonding pad 115 to the connection pad 215 may be formed.

Stitch bonding in which the stitch portion 17, which is a portion of the bonding wire 10, is adhered to the connection pad 215 may be implemented. In some embodiments, when the wire 10P is separated from the stitch portion 17 and/or the connection pad 215, thermal energy or ultrasonic energy may be applied to the wire 10P.

The capillary CA may rise to a level corresponding to the electronic flame-off height, and a new free air ball 10F (see FIG. 16) may be formed at the lower end of the wire 10P through the process of FIG. 16 to be described later. That is, one cycle of the bonding wire formation process is normally terminated, and the capillary CA may be in a state to proceed to or wait for a wire bonding process of a new cycle.

Figure 10:
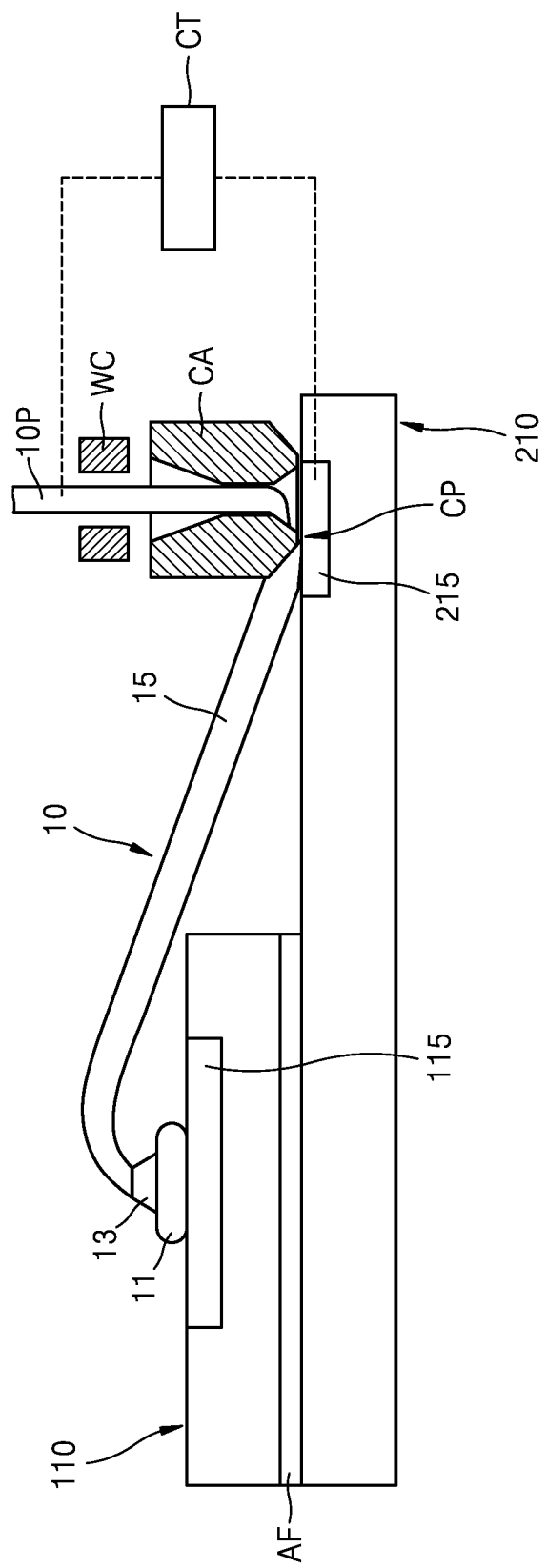

Referring to FIG. 10, before the capillary CA moves upward from the connection pad 215, the controller CT may apply a first electrical signal to the wire 10P and the connection pad 215 to detect a contact failure of the wire 10P. The first electrical signal may be a signal for checking whether the connection pad 215 and the wire 10P are electrically connected.

As shown in FIG. 10, when a defect occurs at the contact point CP, that is, the wire 10P is separated from the connection pad 215, the controller CT may immediately command the bonding equipment to perform an automatic recovery process.

Figure 11:
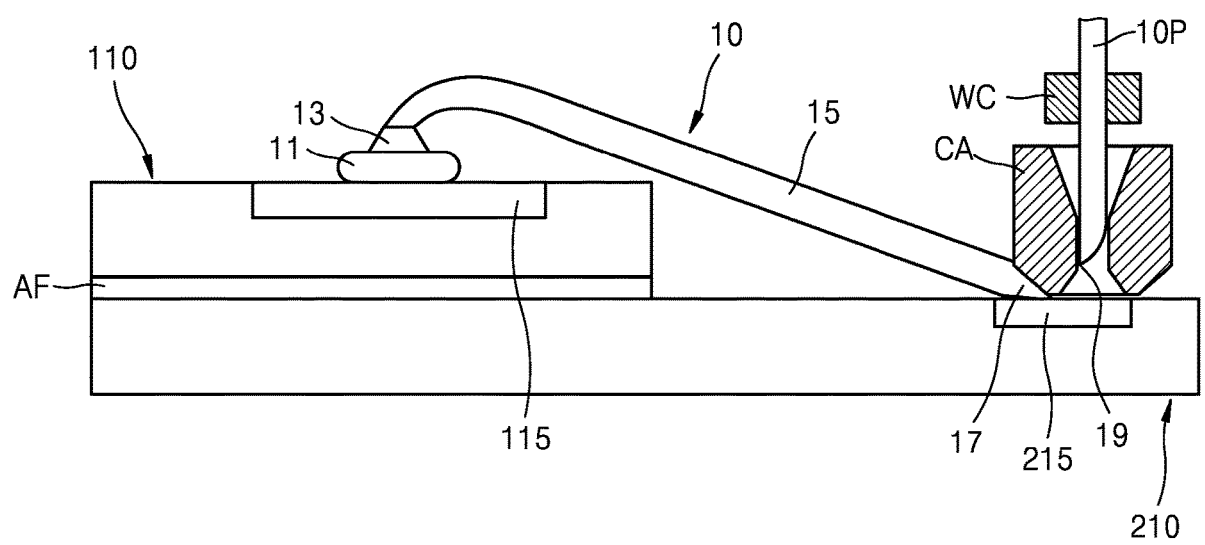

Referring to FIG. 11, when the wire 10P is not in contact with the connection pad 215 (i.e., when a defect has occurred), the state of the clamp WC may be changed to a closed state to prevent the wire 10P from being separated from the capillary CA.

As the state of the clamp WC is changed to the closed state, a tip 19 of the wire 10P may stay inside the capillary CA. The reason is that, when the clamp WC is maintained in an open state, the wire 10P may not contact the connection pad 215 and thus not be fixed, and may be separated from the capillary CA by being wound up by the tension of a reel.

In contrast, when the wire 10P is in contact with the connection pad 215 (i.e., when no defect has occurred), even though the clamp WC is maintained in an open state as shown in FIG. 8, the wire 10P is fixed to the connection pad 215 and thus is not wound up by the tension of the reel.

Figure 12:
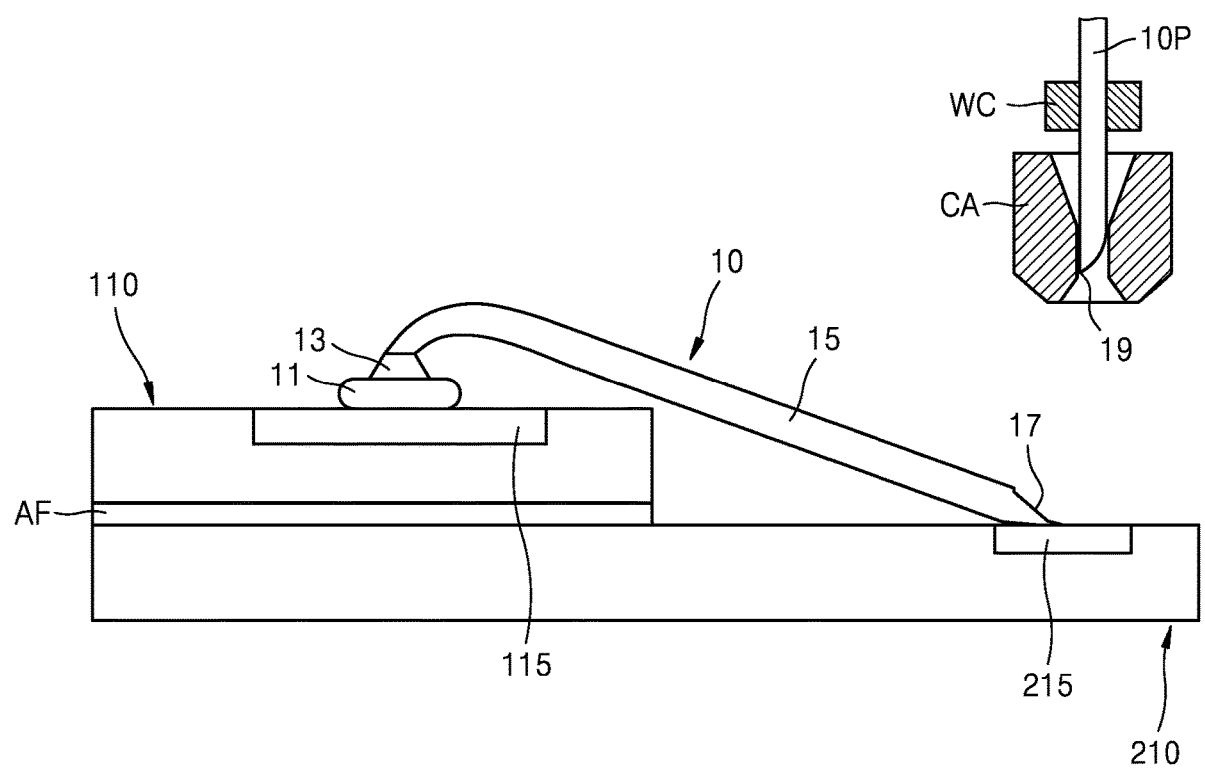

Referring to FIG. 12, as the capillary CA moves upward in the vertical direction from the upper surface of the connection pad 215 in the closed state of the clamp WC, the wire 10P is spaced apart from the connection pad 215.

The bonding wire 10 electrically connecting the bonding pad 115 to the connection pad 215 may be formed by the upward movement of the capillary CA. Stitch bonding in which the stitch portion 17, which is a portion of the bonding wire 10, is adhered to the connection pad 215 may be implemented.

However, unlike in FIG. 9, the tip 19 of the wire 10P does not protrude from the capillary CA and is located inside the capillary CA. As such, it is not possible to form a free air ball at the tip 19 of the wire 10P.

Figure 13:
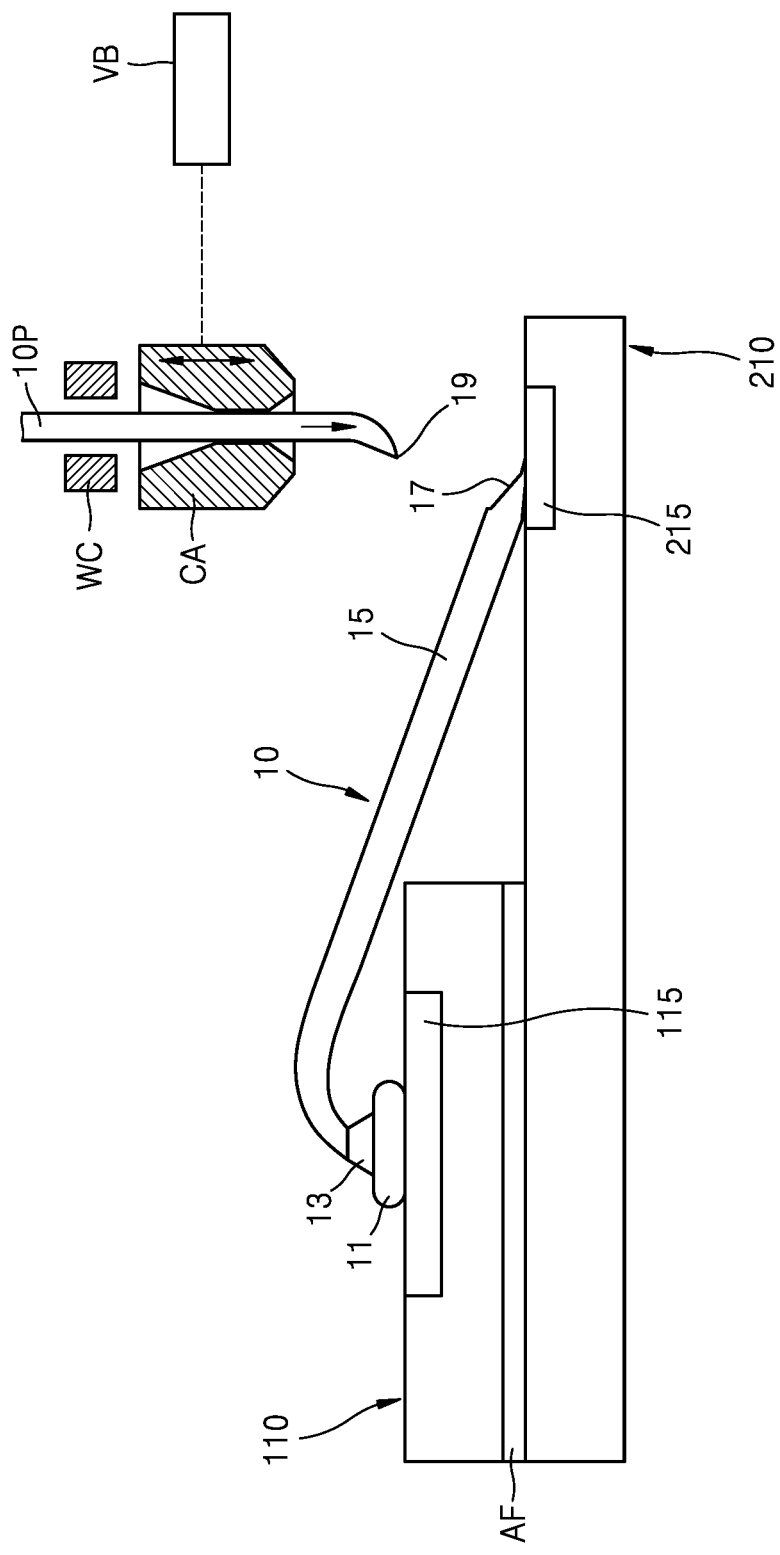

Referring to FIG. 13, the state of the clamp WC is changed to an open state, and the capillary CA is vertically (i.e., up and down) vibrated such that the tip 19 of the wire 10P protrudes to the outside of the capillary CA.

Due to the vertical vibration of the capillary CA using a vibration device VB, the tip 19 of the wire 10P may protrude to the outside of the capillary CA (i.e., extend from a central hole or aperture of the capillary CA as illustrated in FIG. 13) and may move downward in a direction in which the connection pad 215 is located.

In some embodiments, ultrasonic vibration may be additionally applied to the capillary CA during the process of vertically vibrating the capillary CA. However, the ultrasonic vibration may not be necessary in some cases.

Figure 14:
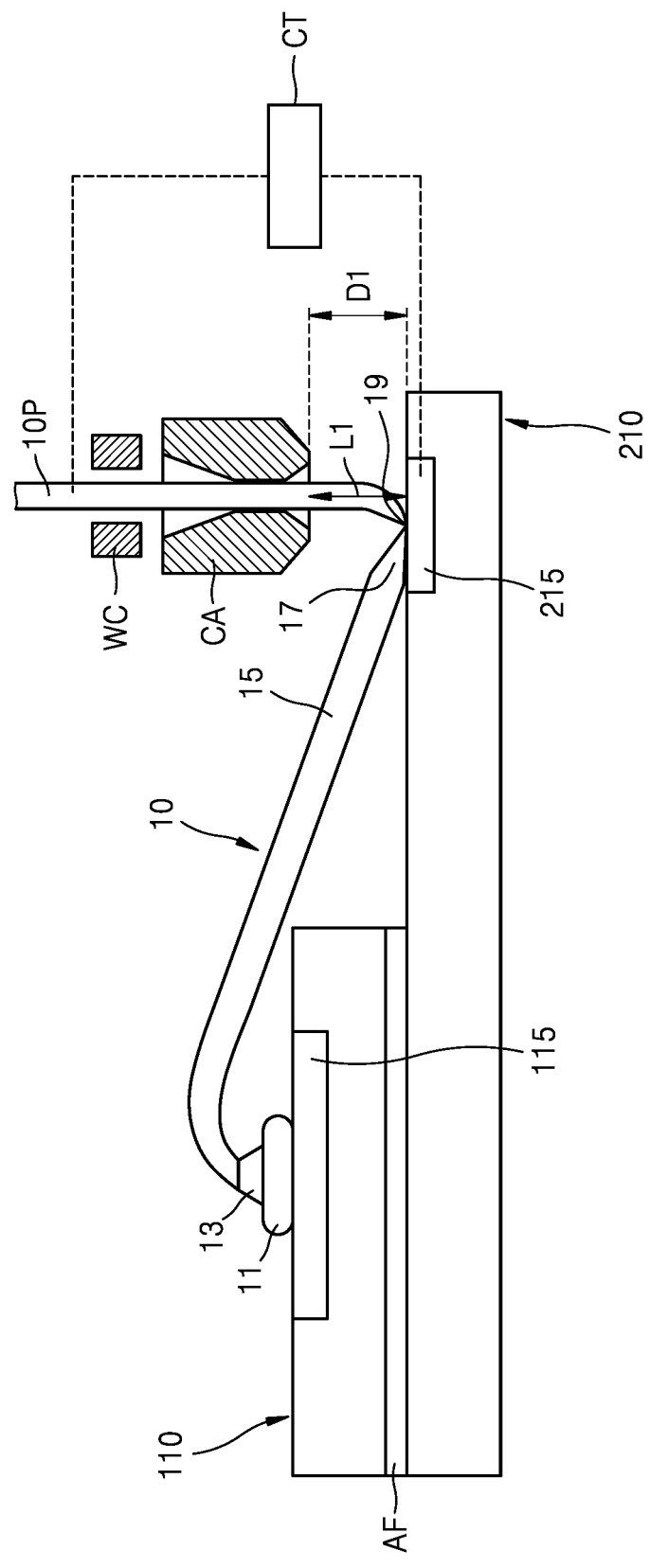

Referring to FIG. 14, the capillary CA moves downward in the vertical direction such that the tip 19 of the wire 10P protruding to the outside contacts the connection pad 215.

In the process of moving the capillary CA downward, the lowering of the capillary CA may be stopped at a position where the lowermost end of the capillary CA and the uppermost surface of the connection pad 215 are spaced apart from each other by a first distance D1.

The controller CT may apply a second electrical signal to the wire 10P and the connection pad 215 and detect whether the tip 19 of the wire 10P is in contact with the connection pad 215. The second electrical signal may be a signal for checking whether the connection pad 215 and the wire 10P are electrically connected.

When a first length L1 of the wire 10P protruding to the outside of the capillary CA is less than the first distance D1, the tip 19 of the wire 10P and the connection pad 215 may not be in contact with each other. In this case, by repeatedly performing the process of vertically vibrating the capillary CA, the first length L1 of the wire 10P may be adjusted to be equal to the first distance D1 or be greater than the first distance D1.

Figure 15:
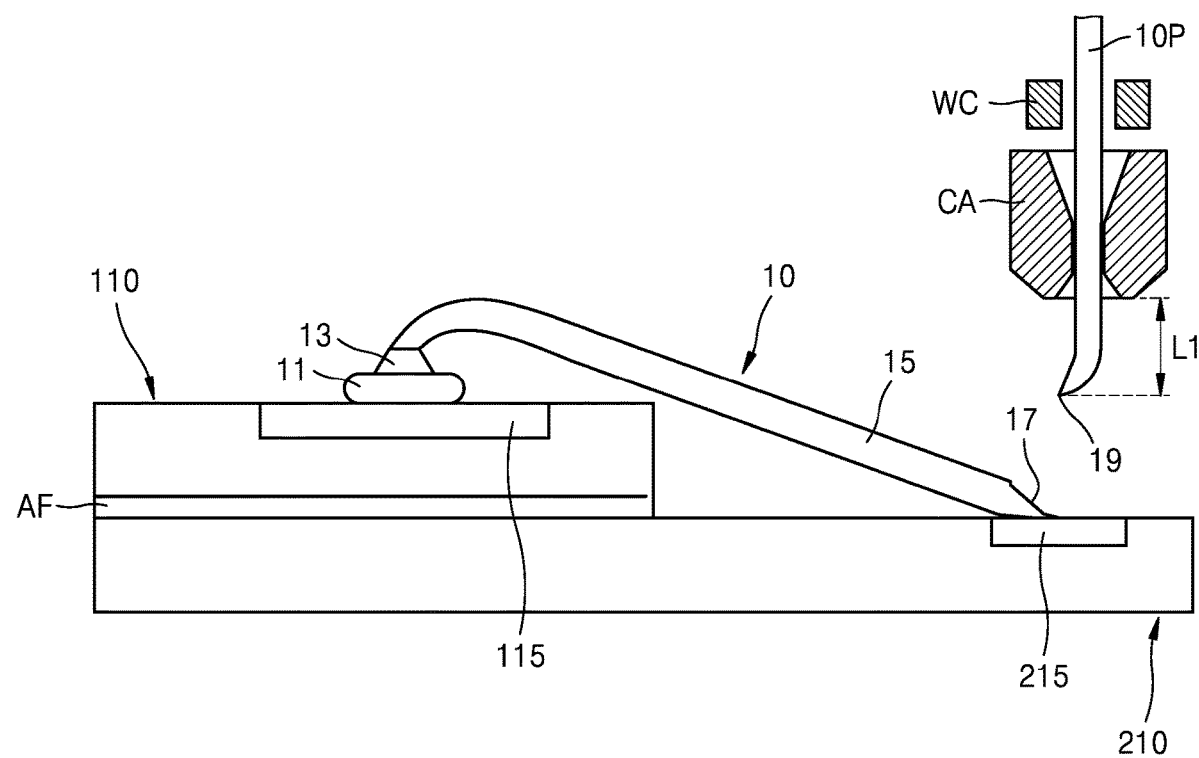

Referring to FIG. 15, when the tip 19 of the wire 10P protruding to the outside of the capillary CA contacts the connection pad 215, the state of the clamp WC is changed to a closed state, and the capillary CA rises again.

When the first length L1 of the wire 10P protruding to the outside of the capillary CA is equal to the first distance D1, it is possible to form a free air ball on the tip 19 of the wire 10P, and thus, the capillary CA is raised again to move the capillary CA to an electronic flame-off height.

Figure 16:
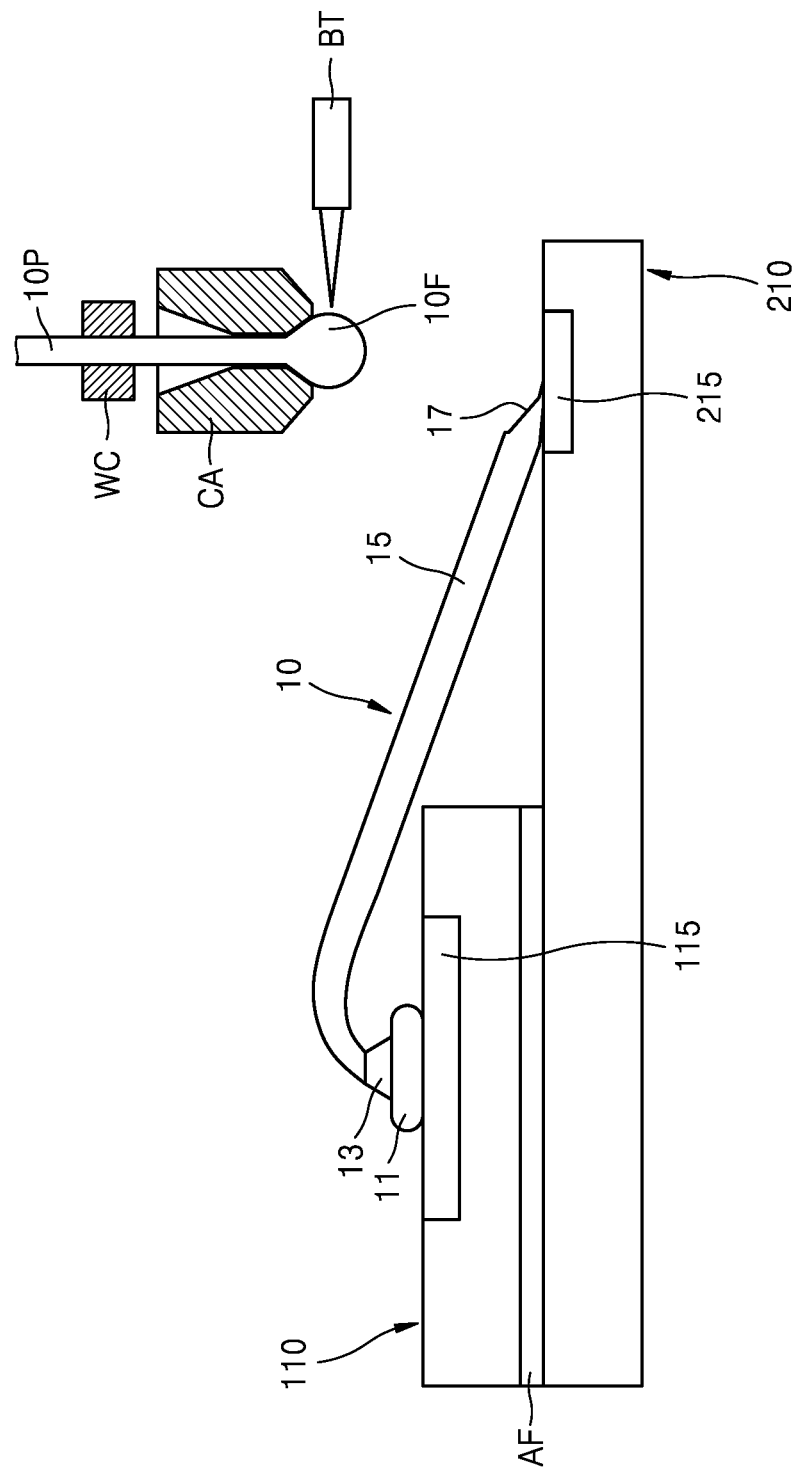

Referring to FIG. 16, a new free air ball 10F may be formed at the lower end of the wire 10P.

Electric spark may be provided to the lower end of the wire 10P protruding from a center hole of the capillary CA by using a discharge electrode BT, and thus, the lower end of the wire 10P may be melted. Accordingly, in the center hole of the capillary CA, the new free air ball 10F may be formed at the lower end of the wire 10P. In some embodiments, ultrasonic energy or thermal energy may be provided to the lower end of the wire 10P instead of the electric spark.

That is, one cycle of the bonding wire formation process is normally terminated, and the capillary CA may be in a state to proceed to or wait for a wire bonding process of a new cycle.

Figure 17:
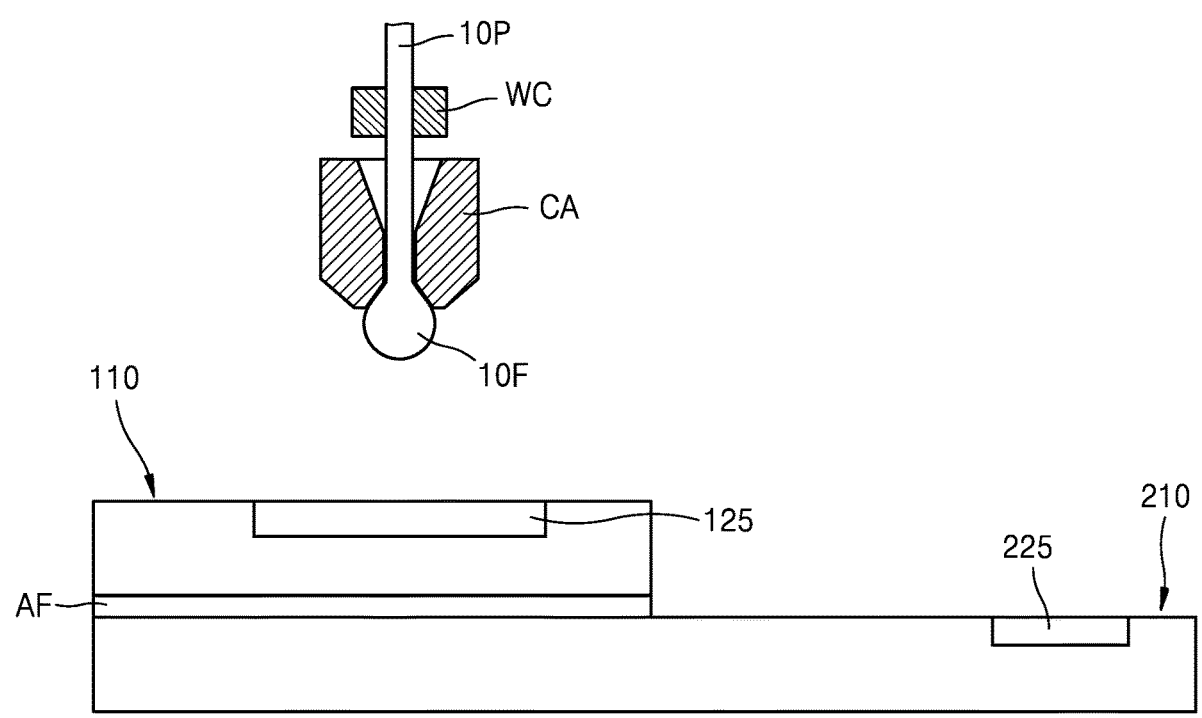

Referring to FIG. 17, the wire 10P on which the free air ball 10F is formed may be moved onto a bonding pad 125 of the semiconductor chip 110.

A state in which a bonding wire 20 (see FIG. 18) electrically connecting the bonding pad 125 to a connection pad 225 of the package substrate 210 may be continuously formed may be provided.

The bonding pad 125 may be referred to as a second bonding pad, and the connection pad 225 may be referred to as a second connection pad.

Figure 18:
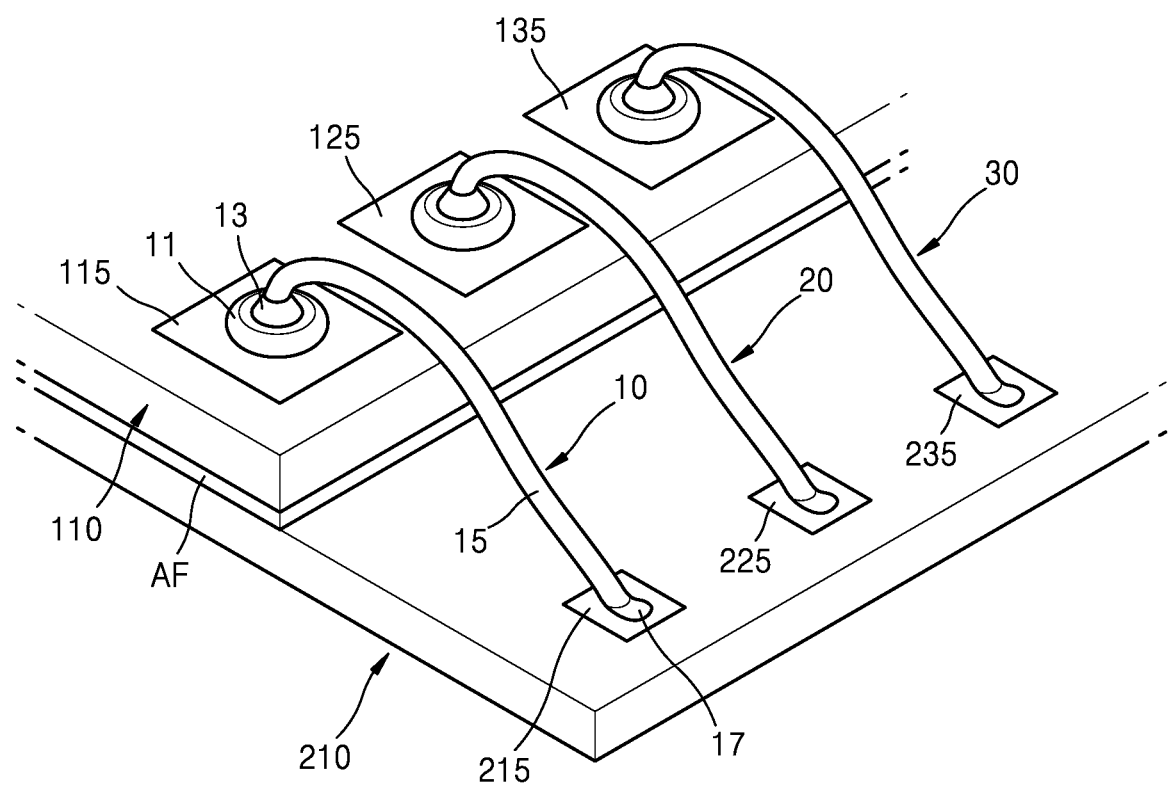
FIG. 18 is a perspective view of a semiconductor package including a plurality of bonding wires manufactured by a wire bonding method according to an embodiment of the inventive concept.

FIG. 18 is a perspective view of a semiconductor package including a plurality of bonding wires manufactured by a wire bonding method according to an embodiment of the inventive concept.

Referring to FIG. 18, a semiconductor package 100 including bonding wires 10, 20, and 30 formed through a continuous process is shown.

A semiconductor chip 110 may include bonding pads 115, 125, and 135. A package substrate 210 may include connection pads 215, 225, and 235. The semiconductor package 100 may include the bonding wires 10, 20, and 30 electrically connecting the bonding pads 115, 125, and 135 to the connection pads 215, 225, and 235, respectively.

Referring back to FIG. 1, a molding member 310 may be formed on the package substrate 210 to surround the semiconductor chip 110 and the bonding wires 10, 20, and 30 to manufacture the semiconductor package 100.

The molding member 310 may protect the semiconductor chip 110 and the bonding wires 10, 20, and 30 from external influences such as contamination and impact. In order to perform this function, the molding member 310 may surround the semiconductor chip 110 and all of the bonding wires 10, 20, and 30 and have a certain thickness. Because the molding member 310 entirely covers the package substrate 210, the width of the molding member 310 may be substantially the same as the width of the semiconductor package 100.

The wire bonding method according to the embodiment of the inventive concept further includes an automatic recovery process for solving a temporary suspension of bonding equipment due to a poor contact of the bonding wires 10, 20, and 30. Accordingly, the operation rate of the bonding equipment for forming the bonding wires 10, 20, and 30 may increase, thereby ultimately increasing the manufacturing efficiency of the semiconductor package 100 and improving productivity and economical efficiency.

Figure 19:
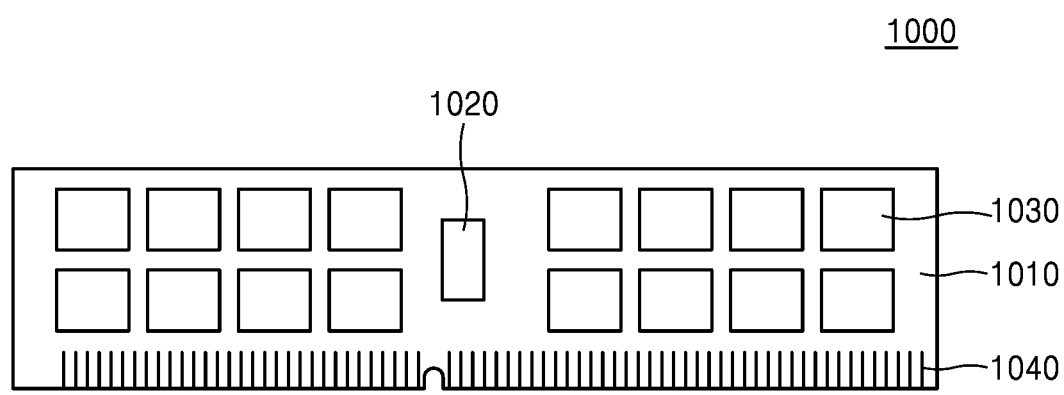
FIG. 19 is a plan view of a semiconductor module including a semiconductor package including a bonding wire manufactured by a wire bonding method according to an embodiment of the inventive concept.

FIG. 19 is a plan view of a semiconductor module 1000 including a semiconductor package including a bonding wire manufactured by a wire bonding method according to an embodiment of the inventive concept.

Referring to FIG. 19, the semiconductor module 1000 may include a module board 1010, a control chip 1020 mounted on the module board 1010, and a plurality of semiconductor packages 1030 mounted on the module board 1010.

A plurality of input/output terminals 1040, which may be inserted into a socket of a main board, may be arranged at a side of the module board 1010. At least one of the semiconductor packages 1030 may include the semiconductor package 100 manufactured by the wire bonding method described with reference to FIGS. 1 to 18.

Figure 20:
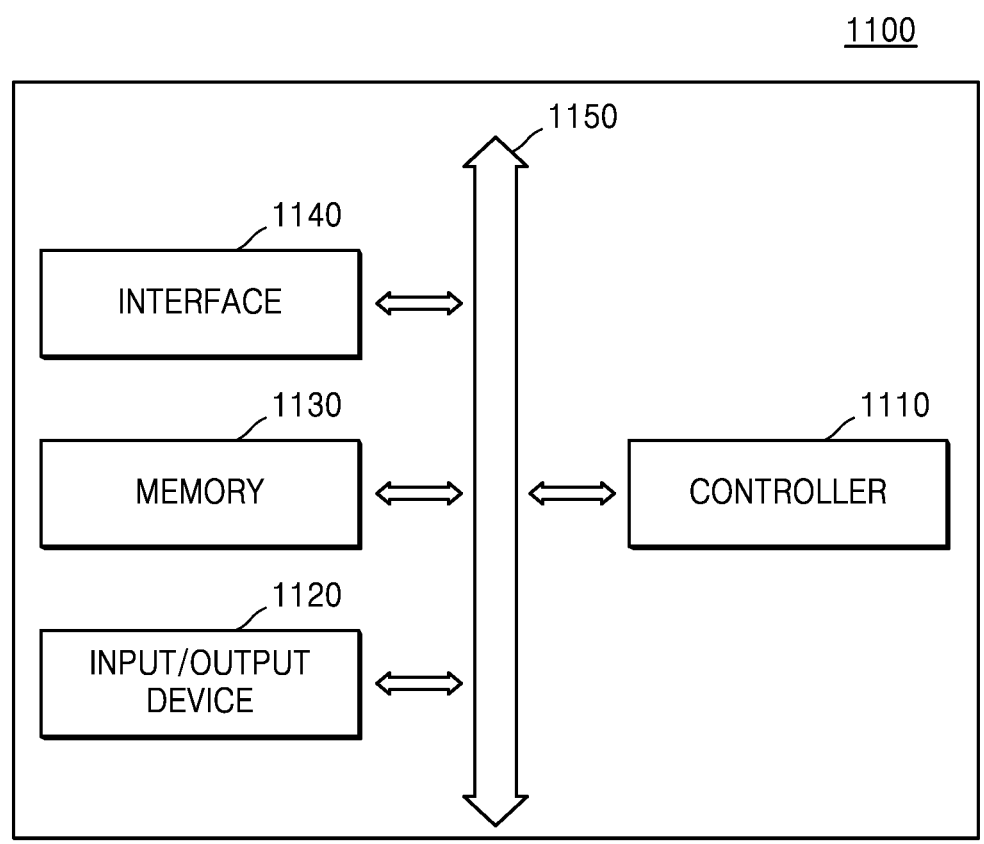
FIG. 20 is a block diagram of a system of a semiconductor package including a bonding wire manufactured by a wire bonding method according to an embodiment of the inventive concept.

FIG. 20 is a block diagram of a system 1100 of a semiconductor package including a bonding wire manufactured by the wire bonding method according to an embodiment of the inventive concept.

Referring to FIG. 20, the system 1100 may include a controller 1110, an input/output device 1120, a memory 1130, an interface 1140, and a bus 1150.

The system 1100 may transmit or receive information. The system 1100 may be a mobile system. In some embodiments, the mobile system may be a portable computer, a tablet, a mobile phone, a digital music player, or a memory card.

The controller 1110 may control an executable program in the system 1100. The controller 1110 may include a microprocessor, a digital signal processor, a microcontroller, or a device similar thereto.

The input/output device 1120 may be used to input or output data of the system 1100. The system 1100 may be connected to an external device, e.g., a personal computer or a network, via the input/output device 1120 and may exchange data with the external device. The input/output device 1120 may include, for example, a touch pad, a keyboard, or a display.

The memory 1130 may store data for operation of the controller 1110 or data processed by the controller 1110. The memory 1130 may include the semiconductor package 100 manufactured by the wired bonding method described with reference to FIGS. 1 to 18.

The interface 1140 may be a data transmission path between the system 1100 and an external device. The controller 1110, the input/output device 1120, the memory 1130, and the interface 1140 may communicate with one another via the bus 1150.

While the inventive concept has been particularly shown and described with reference to embodiments thereof, it will be understood that various changes in form and details may be made therein without departing from the scope of the following claims.

What is claimed is:

1. A wire bonding method comprising:
bonding a tip of a wire provided through a clamp and a capillary onto a bonding pad of a semiconductor chip;
moving the capillary to a connection pad of a package substrate corresponding to the bonding pad;
bonding the wire to the connection pad to form a bonding wire connecting the bonding pad to the connection pad;
applying a first electrical signal to the wire to detect whether the wire and the connection pad are in contact with each other;
changing a state of the clamp to a closed state when the wire is not in contact with the connection pad, and maintaining the state of the clamp in an open state when the wire is in contact with the connection pad;
raising the capillary from the connection pad while maintaining the closed state of the clamp if the wire is not in contact with the connection pad, or maintaining the open state of the clamp if the wire is in contact with the connection pad;
after raising the capillary from the connection pad when the wire is not in contact with the connection pad, changing the state of the clamp to the open state and vibrating the capillary up and down such that the tip of the wire protrudes from the capillary;
lowering the capillary such that the tip of the wire is in contact with the connection pad;
applying a second electrical signal to the wire to detect whether the tip of the wire and the connection pad are in contact with each other;
changing the state of the clamp to the closed state when the tip of the wire and the connection pad are in contact with each other; and
raising the capillary again.

2. The wire bonding method of claim 1, wherein lowering the capillary is performed such that the capillary is stopped at a position where a lowermost end of the capillary and an uppermost surface of the connection pad are spaced apart from each other by a first distance.

3. The wire bonding method of claim 2, wherein, when a length of the wire protruding from the capillary is less than the first distance and the tip of the wire and the connection pad are not in contact with each other, vibrating the capillary up and down is performed repeatedly.

4. The wire bonding method of claim 1, wherein vibrating the capillary up and down is performed in combination with applying ultrasonic vibration to the capillary.

5. The wire bonding method of claim 1, further comprising, after raising the capillary again, forming a free air ball at the tip of the wire.

6. The wire bonding method of claim 5, wherein a continuous process is performed until the bonding of the tip of the wire in a state in which the tip of the wire is not separated from the capillary.

7. The wire bonding method of claim 1, wherein, when the capillary is raised from the connection pad when the wire is not in contact with the connection pad, the tip of the wire is located inside the capillary.

8. The wire bonding method of claim 7, wherein the clamp fixes the wire such that the tip of the wire is located inside the capillary.

9. The wire bonding method of claim 1, wherein bonding the tip of the wire onto the bonding pad comprises providing thermal energy and/or ultrasonic energy to the semiconductor chip such that the tip of the wire is ball bonded to the bonding pad, and wherein bonding the wire to the connection pad comprises adhering a stitch portion of the bonding wire to the connection pad.

10. A wire bonding method comprising:

forming a first bonding wire by continuously bonding a wire passing through a clamp and a capillary to a bonding pad of a semiconductor chip and a connection pad of a package substrate;

before the capillary is raised from the connection pad in order to form a second bonding wire, applying a first electrical signal to the wire to detect whether the wire and the connection pad are in contact with each other;

changing a state of the clamp to a closed state when the wire is not in contact with the connection pad to locate a tip of the wire inside the capillary;

raising the capillary from the connection pad while maintaining the closed state of the clamp;

changing the state of the clamp to an open state and vibrating the capillary up and down such that the tip of the wire located inside the capillary protrudes from the capillary;

forming a free air ball at the tip of the wire protruding from the capillary;

lowering the capillary such that the tip of the wire is in contact with the connection pad;

applying a second electrical signal to the wire to detect whether the tip of the wire and the connection pad are in contact with each other;

changing the state of the clamp to the closed state when the tip of the wire and the connection pad are in contact with each other; and then raising the capillary again.

11. The wire bonding method of claim 10, wherein vibrating the capillary up and down is performed in combination with applying ultrasonic vibration to the capillary.

12. The wire bonding method of claim 10, wherein lowering the capillary comprises stopping a lowermost end of the capillary a distance from an uppermost surface of the connection pad that is equal to a length of the wire protruding from the capillary.

13. The wire bonding method of claim 10, wherein forming the free air ball comprises providing one of the following to the tip of the wire: an electric spark, ultrasonic energy, thermal energy.

14. The wire bonding method of claim 10, wherein each of the first electrical signal and the second electrical signal is applied via a controller.

15. A wire bonding method comprising:

attaching a semiconductor chip on a package substrate;

ball-bonding a first free air ball formed on a tip of a wire to a first bonding pad of the semiconductor chip, the wire provided through a reel and passing through a clamp and a capillary;

moving the capillary to a first connection pad of the package substrate corresponding to the first bonding pad such that the wire forms a loop;

stitch-bonding the wire to the first connection pad to form a first bonding wire connecting the first bonding pad to the first connection pad;

applying a first electrical signal to the wire to detect whether the wire and the first connection pad are in contact with each other;

changing a state of the clamp to a closed state when the wire is not in contact with the first connection pad;

raising the capillary from the first connection pad while maintaining the closed state of the clamp;

changing the state of the clamp to an open state and vibrating the capillary up and down such that the tip of the wire protrudes from the capillary;

lowering the capillary such that the tip of the wire is in contact with the first connection pad;

applying a second electrical signal to the wire to detect whether the tip of the wire and the first connection pad are in contact with each other;

changing the state of the clamp to the closed state when the tip of the wire and the first connection pad are in contact with each other, and raising the capillary again; and forming a second free air ball at the tip of the wire.

16. The wire bonding method of claim 15, further comprising:

after forming the second free air ball at the tip of the wire, ball-bonding the second free air ball formed on the tip of the wire to a second bonding pad of the semiconductor chip;

moving the capillary to a second connection pad of the package substrate corresponding to the second bonding pad such that the wire forms a loop; and stitch-bonding the wire to the second connection pad and forming a second bonding wire connecting the second bonding pad to the second connection pad.

17. The wire bonding method of claim 16, wherein, after forming the first bonding wire, a continuous process is performed until the forming of the second bonding wire in a state in which the clamp fixes the wire such that the tip of the wire is not separated from the capillary and is located inside the capillary.

18. The wire bonding method of claim 15, wherein each of the first electrical signal and the second electrical signal is applied via a controller.

19. The wire bonding method of claim 15, wherein, lowering the capillary is stopped at a position where a lowermost end of the capillary and an uppermost surface of the first connection pad are spaced apart from each other by a first distance, and when a length of the wire protruding from the capillary is less than the first distance and the tip of the wire and the first connection pad are not in contact with each other, vibrating the capillary up and down is performed repeatedly.

* * * * *